United States Patent
Lin et al.

(10) Patent No.: US 11,284,679 B2
(45) Date of Patent: Mar. 29, 2022

(54) ROTATING BUCKLE AND FIXING DEVICE

(71) Applicant: HONGFUJIN PRECISION ELECTRONICS(TIANJIN)CO., LTD., Tianjin (CN)

(72) Inventors: Jia-Feng Lin, New Taipei (TW); Chieh-Hsiang Lin, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 99 days.

(21) Appl. No.: 16/944,543

(22) Filed: Jul. 31, 2020

(65) Prior Publication Data

US 2021/0378365 A1  Dec. 9, 2021

(30) Foreign Application Priority Data

Jun. 3, 2020  (CN) .......................... 202010496779.6

(51) Int. Cl.
*H05K 7/14* (2006.01)
*A44B 11/25* (2006.01)

(52) U.S. Cl.
CPC ...... *A44B 11/2542* (2013.01); *A44B 11/2546* (2013.01); *H05K 7/1405* (2013.01); *H05K 7/1431* (2013.01)

(58) Field of Classification Search
CPC .. H05K 7/1405; H05K 7/1431; H05K 7/1417; B60P 7/15; Y10T 403/59; Y10T 403/595; A44B 11/2542; A44B 11/2546; G06F 1/185
See application file for complete search history.

(56) References Cited

U.S. PATENT DOCUMENTS

| | | | | |
|---|---|---|---|---|
| 5,265,992 A | * | 11/1993 | Jensen | B60P 7/0815 410/104 |
| 5,540,515 A | * | 7/1996 | Rock | A47B 88/95 292/341.17 |
| 5,752,791 A | * | 5/1998 | Ehrlich | B60P 7/0807 410/101 |
| 5,807,047 A | * | 9/1998 | Cox | B60P 7/15 410/143 |
| 5,823,644 A | * | 10/1998 | Suh | G06F 1/181 312/223.2 |
| 6,364,141 B1 | * | 4/2002 | Ehrgott | A47F 5/0823 211/103 |
| 6,563,699 B1 | * | 5/2003 | Choi | G06F 1/1679 361/679.09 |

(Continued)

*Primary Examiner* — Patrick D Hawn
(74) *Attorney, Agent, or Firm* — ScienBiziP, P.C.

(57) ABSTRACT

A rotating buckle includes a first fixing member, a second fixing member, and a hook body. The first fixing member includes protruding posts. The second fixing member defines limiting slots and comprises a fixing portion. The fixing portion fixes the second fixing member to the first fixing member through a first resilient member. The hook body is received between the first fixing member and the second fixing member. The hook body defines a mounting hole, an inclined slot, and a receiving slot. The protruding posts are inserted through the mounting hole, the inclined slot, and the limiting slots. The fixing portion is inserted through the receiving slot. The hook body is fixed to the first fixing member through a second resilient member.

15 Claims, 7 Drawing Sheets

(56) References Cited

U.S. PATENT DOCUMENTS

| | | | | |
|---|---|---|---|---|
| 6,675,980 B2* | 1/2004 | Ehrgott | ........... | A47F 5/0823 |
| | | | | 211/189 |
| 8,267,613 B2* | 9/2012 | Lindloff | ........... | E05B 17/2038 |
| | | | | 403/322.4 |
| 8,310,834 B2* | 11/2012 | Furholzer | ........... | H02B 1/052 |
| | | | | 361/747 |
| 8,534,777 B2* | 9/2013 | Gong | ........... | G06F 1/187 |
| | | | | 312/223.2 |
| 9,107,321 B2* | 8/2015 | Yin | ........... | H05K 7/1489 |
| 10,667,424 B2* | 5/2020 | Lin | ........... | H05K 7/1411 |
| 10,752,150 B2* | 8/2020 | Johnson | ........... | B60P 3/073 |
| 10,799,024 B2* | 10/2020 | Bektas | ........... | A47B 88/956 |
| 11,197,385 B2* | 12/2021 | Wang | ........... | H05K 7/1405 |
| 2010/0247230 A1* | 9/2010 | Buckingham | ........... | B60R 22/26 |
| | | | | 403/16 |
| 2011/0157805 A1* | 6/2011 | Ml | ........... | F16M 11/24 |
| | | | | 361/679.22 |
| 2011/0182658 A1* | 7/2011 | Lindloff | ........... | B62J 1/28 |
| | | | | 403/316 |
| 2012/0301212 A1* | 11/2012 | Champ | ........... | B60N 2/305 |
| | | | | 403/27 |
| 2014/0227021 A1* | 8/2014 | Kamen | ........... | A61M 5/1414 |
| | | | | 403/14 |
| 2015/0284096 A1* | 10/2015 | De Morais | ........... | B64C 1/20 |
| | | | | 403/327 |
| 2021/0345507 A1* | 11/2021 | Wang | ........... | G06F 1/186 |

* cited by examiner

ROTATING BUCKLE AND FIXING DEVICE

FIELD

The subject matter herein generally relates to fixing devices, and more particularly to a rotating buckle of a fixing device.

BACKGROUND

When the existing buckle is removed from a structure, the usual method is to first rotate the buckle by a predetermined angle to disengage the buckle from the structure, and then pull the buckle away from the shelf. To fix the buckle on the shelf again, the reverse procedure is used. However, fixing and removing the buckle is cumbersome this way.

BRIEF DESCRIPTION OF THE DRAWINGS

Implementations of the present disclosure will now be described, by way of embodiments, with reference to the attached figures.

DETAILED DESCRIPTION

Figure 1:
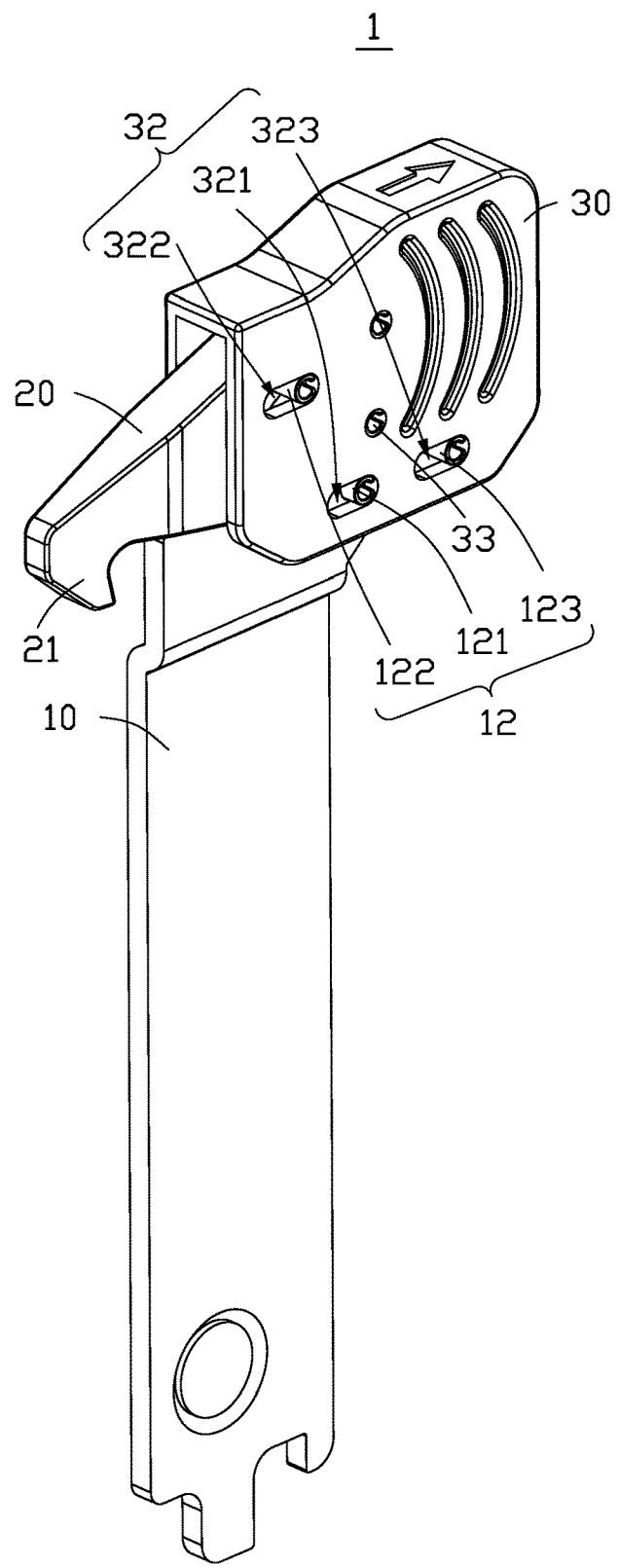
FIG. 1 is a schematic perspective view of a rotating buckle according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder but can have one or more deviations from a true cylinder. The term "comprising" means "including, but not necessarily limited to"; it specifically indicates open-ended inclusion or membership in a so-described combination, group, series, and the like.

Figure 2:
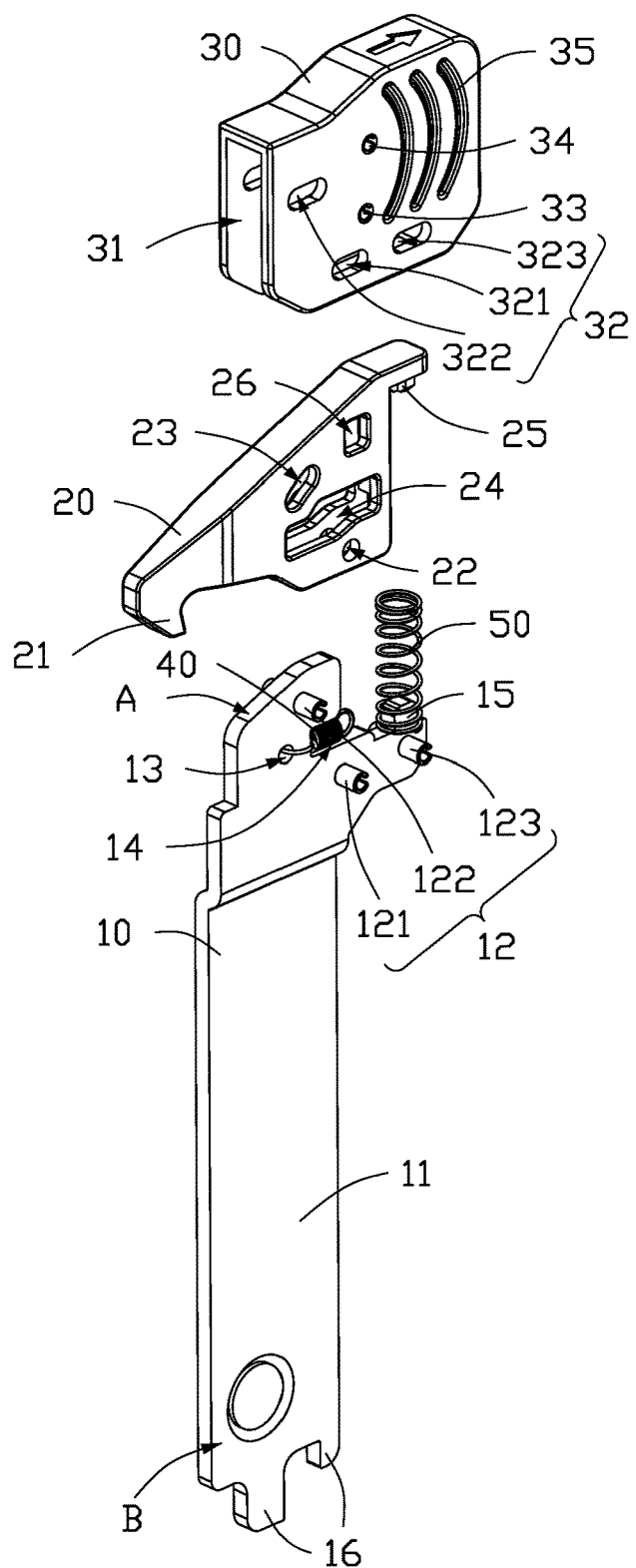
FIG. 2 is an exploded schematic view of the rotating buckle shown in FIG. 1.
Figure 3:
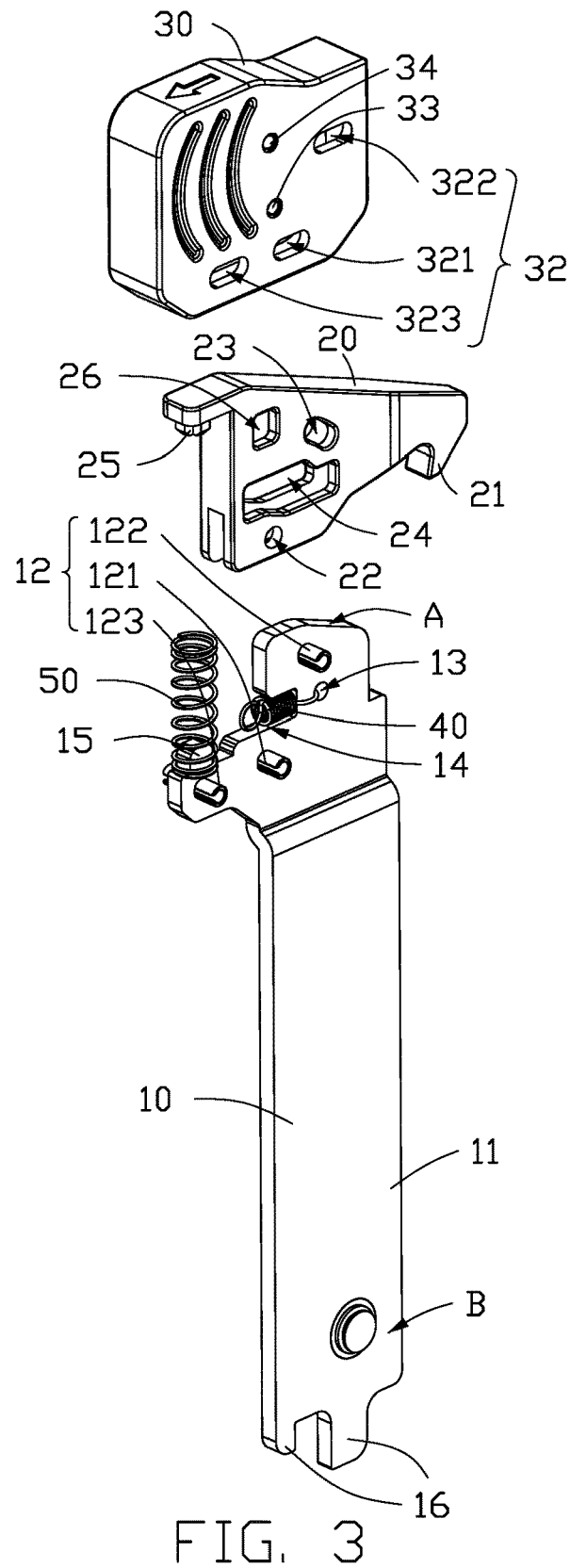
FIG. 3 is an exploded schematic view of the rotating buckle shown in FIG. 2 from another perspective.

FIG. 1, FIG. 2, and FIG. 3 show an embodiment of a rotating buckle 1 used for fixing a product on a mounting bracket. The rotating buckle 1 includes a first fixing member 10, a second fixing member 30, and a hook body 20. Protruding posts 12 are provided on the first fixing member 10. The second fixing member 30 is provided with a fixing portion 33. The fixing portion 33 is connected to the first fixing member 10 through a first resilient member 40. Limiting slots 32 are defined in the second fixing member 30. The hook body 20 is provided between the first fixing member 10 and the second fixing member 30. The hook body 20 defines a mounting hole 22, an inclined slot 23, and a receiving slot 24. The protruding posts 12 extend into the mounting hole 22, the inclined slot 23, and the limiting slots 32. The fixing portion 33 extends into the receiving slot 24. The hook body 20 is connected to the first fixing member 10 through a second resilient member 50.

When the second fixing member 30 is pulled, the first resilient member 40 stretches, and the second fixing member 30 drives the hook body 20 to move through the fixing portion 33, and the hook body 20 rotates through the cooperation between the protruding posts 12 and the inclined slot 23, the second resilient member 50 compresses, and the hook body 20 disengages from the mounting frame.

When the second fixing member 30 is released, the second fixing member 30 and the hook body 20 are reset by the first resilient member 40 and the second resilient member 50, respectively.

Referring to FIG. 2, the first fixing member 10 includes a connecting rod 11. The protruding posts 12 are located adjacent to a first end A of the connecting rod 11, and a second end B of the connecting rod 11 cooperates with the mounting frame.

The first end A has a substantially "L" shaped structure. The protruding posts 12 include a first protruding post 121 and a second protruding post 122. The first protruding post 121 and the second protruding post 122 extend into the hook body 20 and the second fixing member 30.

A circular hole 13 and a notch 14 are defined adjacent to the first end A between the first protruding post 121 and the second protruding post 122. The first resilient member 40 is received in the notch 14, and one end of the first resilient member 40 passes through the circular hole 13 and hooks on the first fixing member 10.

The first fixing member 10 further includes a first connecting portion 15 adjacent to the first end A, and one end of the second resilient member 50 is connected to the first connecting portion 15.

The first fixing member 10 further includes a latching portion 16 adjacent to the second end B. The latching portion 16 extends into the mounting frame for fixing the second end B on the mounting frame.

It can be understood that, in other embodiments and according to specific needs, the shape of the first end A can be replaced by a "T" shape, and the connecting rod 11 can be replaced by a connecting post.

Referring to FIG. 2, a cross-sectional shape of the hook body 20 is substantially triangular. In an original state, the hook body 20 is substantially perpendicular to the first fixing member 10. The hook body 20 includes a hook 21 for fixing the rotating buckle 1 on the mounting frame.

The hook body 20 is provided adjacent to the first end A. The first protruding post 121 extends into the mounting hole 22, and when the hook body 20 rotates, the first protruding post 121 serves as a center of rotation.

The inclined slot 23 is an oblong groove. The second protruding post 122 extends into the inclined slot 23 and is configured to move along the inclined slot 23 as the hook body 20 rotates. In other embodiments, an extending direction of the inclined slot 23 can be set according to specific needs.

The hook body 20 is substantially hollow, so that the hook body 20 can be sleeved on the first end A of the first fixing member 10. The notch 14 corresponds to the receiving slot 24, and the length of the receiving slot 24 is greater than the length of the notch 14, so that the first resilient member 40 has sufficient space to deform.

The hook body 20 includes a second connecting portion 25 extending from a side of the hook body 20 away from the hook 21. The second connecting portion 25 is connected to the other of the second resilient member 50 extending away from the first connecting portion 15.

Referring to FIGS. 2 and 3, the second fixing member 30 defines a receiving cavity 31. The second fixing member 30 is sleeved on the hook body 20, so that the hook body 20 is received between the first fixing member 10 and the second fixing member 30. The limiting slots 32 correspond to the protruding posts 12. Specifically, the limiting slot 32 includes a first limiting slot 321 and a second limiting slot 322.

The first limiting slot 321 corresponds to the mounting hole 22, and the second limiting slot 322 corresponds to the inclined slot 23. The first protruding post 121 extends into the first limiting slot 321 after passing through the mounting hole 22, and the second protruding post 122 extends into the second limiting slot 322 through the inclined slot 23. The first limiting slot 321 and the second limiting slot 322 are both oblong and extend in the same direction, so that the first protruding post 121 and the second protruding post 122 move along the first limiting slot 321 and the second limiting slot 322, respectively. In addition, the first protruding post 121 and the second protruding post 122 prevent the second fixing member 30 from moving perpendicular to the extending direction of the first limiting slot 321 and the second limiting slot 322, thereby increasing the stability of the second fixing member 30.

The fixing portion 33 extends from the second fixing member 30 and is located between the first limiting slot 321 and the second limiting slot 322. The fixing portion 33 extends into the receiving slot 24, and the other end of the first resilient member 40 is connected to the fixing portion 33. When the second fixing member 30 is pulled, the fixing portion 33 resists against the inner wall of the receiving slot 24, so that a pushing force can be applied to the hook body 20 to drive the hook body 20 to move.

In one embodiment, the fixing portion 33 is substantially cylindrical and integrally formed with the second fixing member 30. It can be understood that, in other embodiments, the second fixing member 30 may be a handle or other structure with equivalent functions. The fixing portion 33 can also be replaced with another structure having the same effect, such as a hook, which can also be connected to the first resilient member 40 and resist against the inner wall of the receiving slot 24.

Referring to FIGS. 2 and 3, in one embodiment, the first fixing member 10 is further provided with a third protruding post 123, and the second fixing member 30 is further provided with a third limiting slot 323. The third limiting slot 323 is oblong and extends collinearly with the first limiting slot 321. The third protruding post 123 extends into the third limiting slot 323 to restrict the moving direction of the second fixing member 30 when the second fixing member 30 is pulled.

The cooperation between the first limiting slot 321 and the second limiting slot 322 and the first protruding post 121 and the second protruding post 122 can increase the stability of the second fixing member 30. Further, cooperation between the third limiting slot 323 and the third protruding post 123 can further increase the stability of the second fixing member 30 when being pulled.

Referring to FIG. 3, in one embodiment, the second fixing member 30 is further provided with a resisting portion 34, and the hook body 20 is provided with a through hole 26 at a position corresponding to the resisting portion 34. The resisting portion 34 extends into the through hole 26. When the second fixing member 30 is pulled, the resisting portion 34 resists against an inner wall of the through hole 26 to apply a pushing force on the hook body 20. Specifically, the through hole 26 is substantially a square hole, so that the resisting portion 34 can move in the through hole 26.

The resisting portion 34 further increases the pushing force of the second fixing member 30 to drive the hook body 20 to move, and the fixing portion 33 and the resisting portion 34 simultaneously apply a pushing force on the hook body 20, so that the hook body 20 is moved more easily when the second fixing member 30 is pulled.

Referring to FIG. 2, in one embodiment, the second fixing member 30 is further provided with an anti-slip grooves 35. The anti-slip grooves 35 are used for increasing a frictional force when pulling the second fixing member 30.

Referring to FIG. 2 and FIG. 3, the first resilient member 40 and the second resilient member 50 are perpendicularly received between the first fixing member 10 and the second fixing member 30. The first resilient member 40 provides an elastic force for the second fixing member 30, and the second resilient member 50 provides an elastic force for hook body 20.

In one embodiment, the first resilient member 40 and the second resilient member 50 are springs. It can be understood that in other embodiments, the first resilient member 40 and the second resilient member 50 may be replaced with other structures having equivalent functions.

Figure 4:
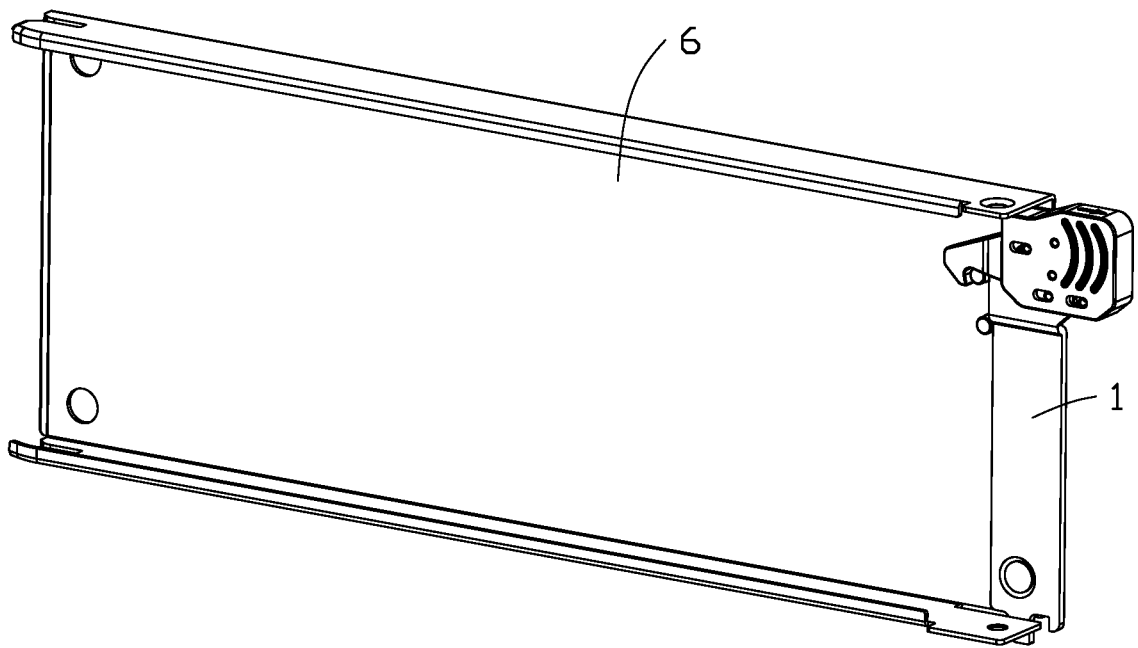
FIG. 4 is a schematic perspective view of a fixing device.

FIG. 4 shows an embodiment of a fixing device 100. The fixing device 100 includes the rotating buckle 1 and a mounting frame 6. One end of the rotating buckle 1 is fixed on the mounting frame 6, and another end of the rotating buckle 1 is detachably fixed on the mounting frame 6.

Specifically, the second end B of the first fixing member 10 is rotationally fixed on the mounting frame 6, and the latching portion 16 extends out of the mounting frame 6. The latching portion 16 bears against the mounting frame 6, so as to prevent over-rotation of the first fixing member 10 relative to the mounting frame 6.

The mounting frame 6 is further provided with a latching member 61, and the hook 21 is configured to hook on the latching member 61, so that the rotating buckle 1 is fixed on the mounting frame 6. In one embodiment, the latching member 61 is substantially cylinder. It can be understood that, in other embodiments, the latching member 61 can adopt other structures for fixing the rotating buckle 1.

In one embodiment, the mounting frame 6 is further provided with a limiting portion 62 for limiting rotation of the connecting rod 11. In one embodiment, the limiting portion 62 is substantially cylindrical. It can be understood that, in other embodiments, the limiting portion 62 can adopt other structures for limiting the connecting rod 11.

The rotating buckle 1 is provided on the mounting frame 6. When an external component (not shown) is mounted in the mounting frame 6, the rotating buckle 1 is used for fixing the external component to prevent the external component from moving. The external component may be an expansion card, a memory card, or another structure.

Figure 5:
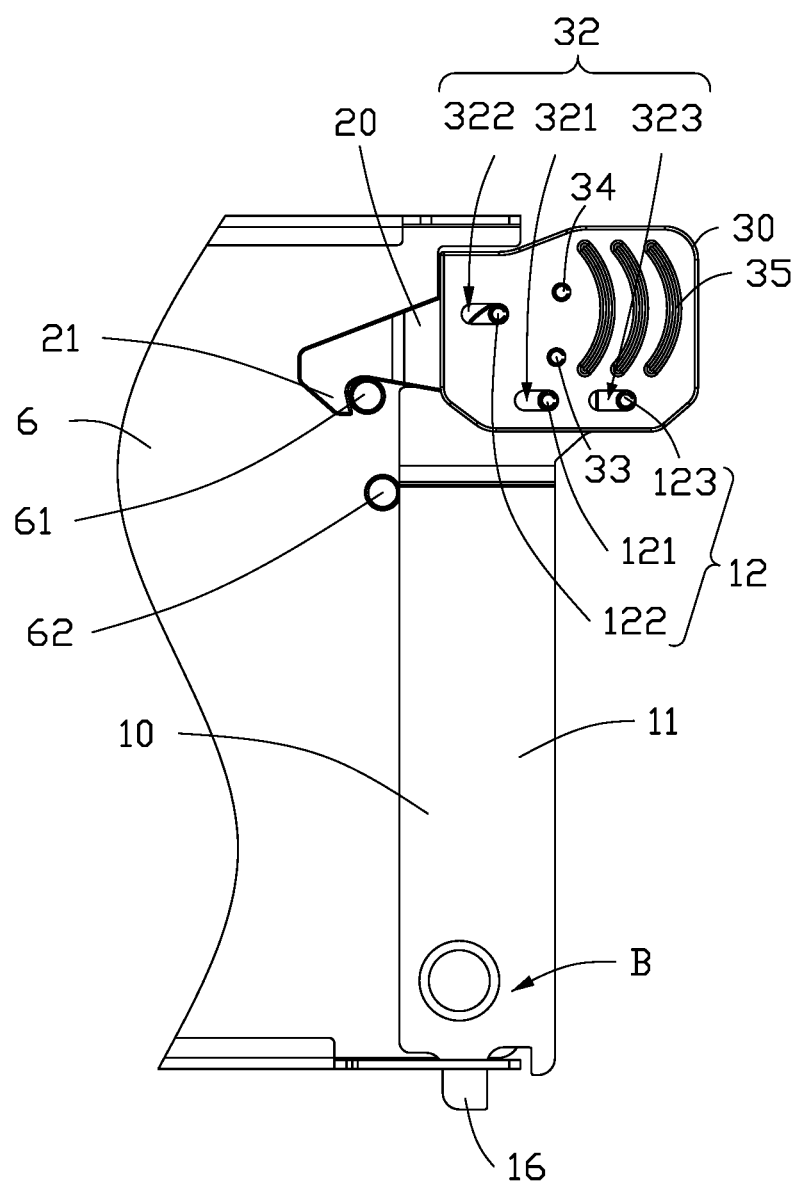
FIG. 5 is a schematic front view of the rotating buckle fixed on a mounting frame of the fixing device.

Referring to FIG. 5, when the rotating buckle 1 is fixed on the mounting frame 6, the first resilient member 40 and the second resilient member 50 are in the original state. The protruding posts 12 are located at a first end of the limiting slots 32.

Figure 6:
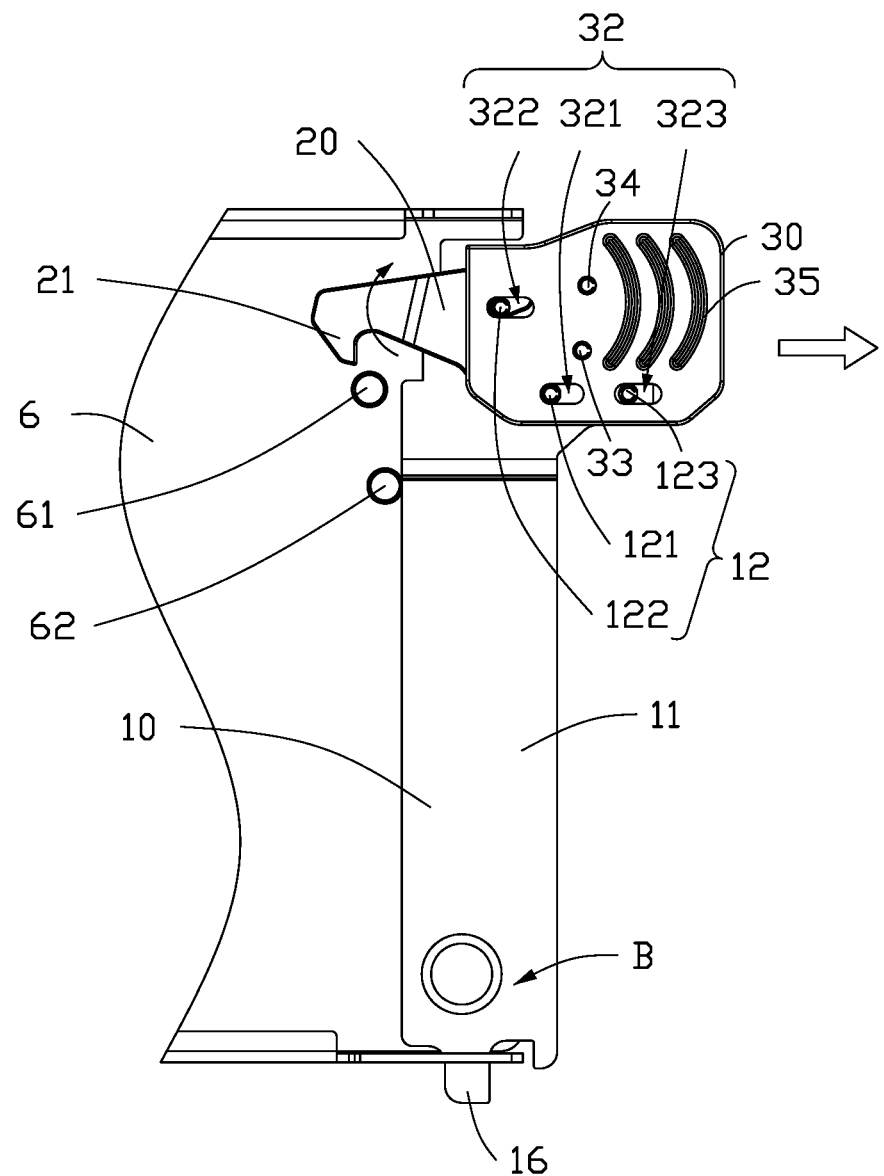
FIG. 6 is a schematic front view of the rotating buckle disengaging from the mounting frame.

Referring to FIG. 6, when the second fixing member 30 is pulled, the first resilient member 40 is stretched, the fixing portion 33 and the resisting portion 34 drive the hook body 20 to move, and the first protruding post 121, the second protruding post 122, and the third protruding post 123 are located at a second end of the first limiting slot 321, the second limiting slot 322, and the third limiting slot 323. Since the second protruding post 122 also extends into the inclined slot 23, while the hook body 20 moves, the hook body 20 also rotates to disengage the hook 21 from the latching member 61, and the second resilient member 50 is compressed. The first fixing member 10 rotates relative to the mounting frame 6.

When the second fixing member 30 is released, the second fixing member 30 is restored by the first resilient member 40, and the hook body 20 is restored by the second resilient member 50.

Figure 7:
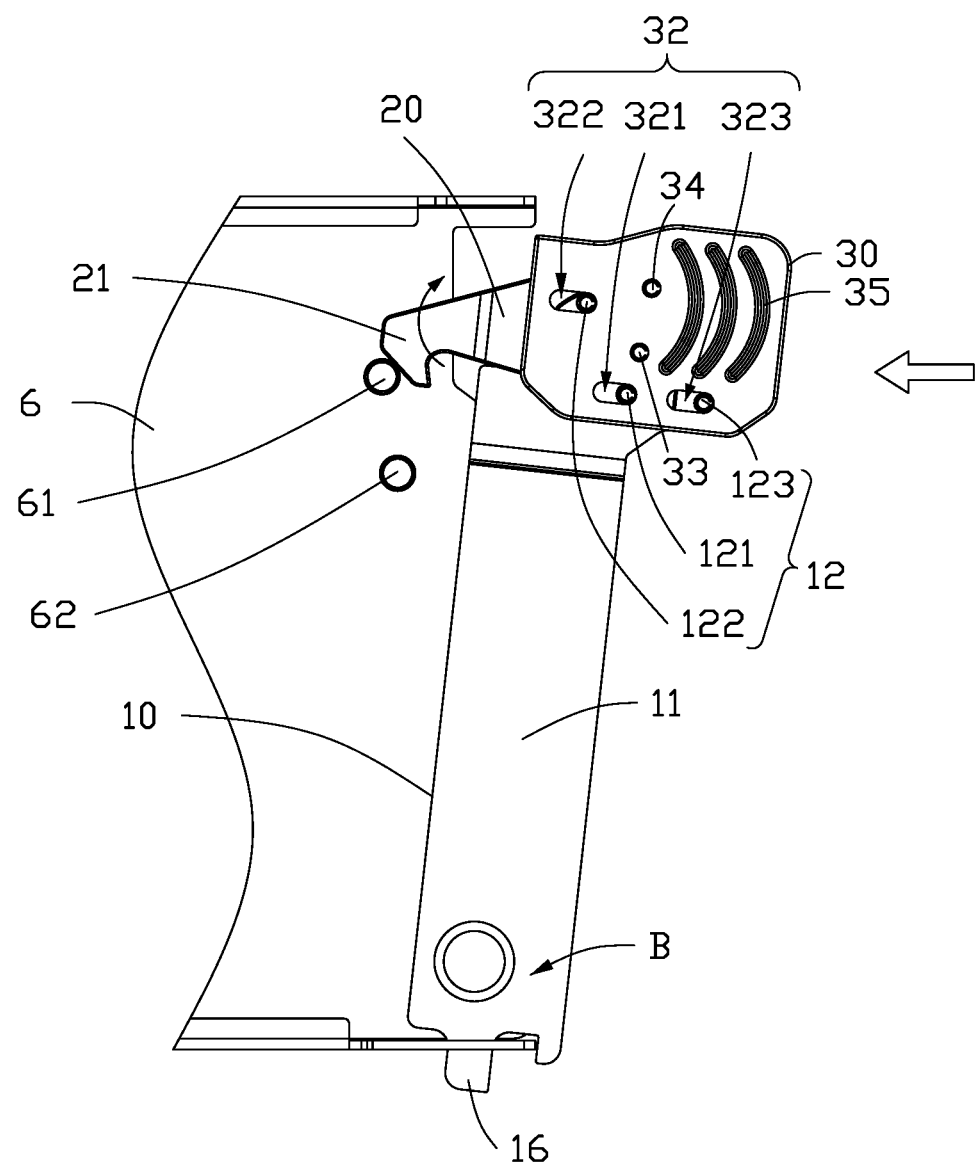
FIG. 7 is a schematic front view of the rotating buckle being fixed on the mounting frame.

Referring to FIG. 7, to fix the hook body 20 on the latching member 61 again, the second fixing member 30 is pushed to drive the hook body 20 toward the latching member 61. The hook 21 of the hook body 20 bears against the latching member 61, so that the hook body 20 rotates until the hook 21 hooks on the latching member 61.

In summary, the hook body 20 can be disengaged from or buckled on the latching portion 61 by pulling the second fixing member 30 or pushing the second fixing member 30, thereby removing the rotating buckle 1 from the mounting frame 6 or removing the rotating buckle 1 from the mounting frame 6. During the process of pulling or pushing the second fixing member 30, the hook body 20 can simultaneously move laterally and rotate, further simplifying the operation of the rotating buckle 1. Moreover, the rotating buckle 1 has a simple structure and is convenient to operate. The fixing device 100 adopting the rotating buckle 1 can more conveniently fix external components on the mounting frame 6 or detach external components from the mounting frame 6.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A rotating buckle for buckling on a mounting frame, the rotating buckle comprising:
   a first fixing member comprising a plurality of protruding posts;
   a second fixing member defining a plurality of limiting slots and comprising a fixing portion, the fixing portion fixing the second fixing member to the first fixing member through a first resilient member;
   a hook body received between the first fixing member and the second fixing member, the hook body defining a mounting hole, an inclined slot, and a receiving slot; wherein:
   the plurality of protruding posts is inserted through the mounting hole, the inclined slot, and the plurality of limiting slots;
   the fixing portion is inserted through the receiving slot;
   the hook body is fixed to the first fixing member through a second resilient member;
   when the second fixing member is pulled, the first resilient member stretches, the fixing portion drives the hook body to move, at least one of the plurality of protrusions and the inclined slot cooperate to drive the hook body to rotate, the second resilient member compresses, and the hook body disengages from the mounting frame; and
   when the second fixing member is released, the second fixing member and the hook body are respectively restored by the first resilient member and the second resilient member.

2. The rotating buckle of claim 1, wherein:
   the plurality of protruding posts comprises a first protruding post and a second protruding post;
   the plurality of limiting slots comprises a first limiting slot and a second limiting slot;
   the first protruding post is inserted through the mounting hole and the first limiting slot, and the second protruding post is inserted through the inclined slot and the second limiting slot.

3. The rotating buckle of claim 2, wherein:
   the first limiting slot and the second limiting slot extend in the same direction.

4. The rotating buckle of claim 2, wherein:
   the plurality of protruding posts further comprises a third protruding post;
   the plurality of limiting slots further comprises a third limiting slot;
   the third limiting slot extends in the same direction as the first limiting slot and the second limiting slot; and
   the third protruding post is inserted through the third limiting slot.

5. The rotating buckle of claim 1, wherein:
   the second fixing member further comprises a resisting portion;
   the hook body defines a through hole;
   the resisting portion is inserted through the through hole;
   when the second fixing member is pulled, the resisting portion resists an inner wall of the through hole to apply a force on the hook body.

6. The rotating buckle of claim 1, wherein:
   the first resilient member and the second resilient member are perpendicularly received between the first fixing member and the second fixing member.

7. The rotating buckle of claim 1, wherein:
   the second fixing member defines an anti-slip groove.

8. A fixing device comprising:
   a mounting frame; and
   a rotating buckle, one end of the rotating buckle fixed on the mounting frame, and another end of the rotating buckle detachably fixed on the mounting frame, the rotating buckle comprising:
   a first fixing member comprising a plurality of protruding posts;
   a second fixing member defining a plurality of limiting slots and comprising a fixing portion, the fixing portion fixing the second fixing member to the first fixing member through a first resilient member;

a hook body received between the first fixing member and the second fixing member, the hook body defining a mounting hole, an inclined slot, and a receiving slot; wherein:

the plurality of protruding posts is inserted through the mounting hole, the inclined slot, and the plurality of limiting slots;

the fixing portion is inserted through the receiving slot;

the hook body is fixed to the first fixing member through a second resilient member;

when the second fixing member is pulled, the first resilient member stretches, the fixing portion drives the hook body to move, at least one of the plurality of protrusions and the inclined slot cooperate to drive the hook body to rotate, the second resilient member compresses, and the hook body disengages from the mounting frame; and when the second fixing member is released, the second fixing member and the hook body are respectively restored by the first resilient member and the second resilient member.

9. The fixing device of claim 8, wherein:
the plurality of protruding posts comprises a first protruding post and a second protruding post;
the plurality of limiting slots comprises a first limiting slot and a second limiting slot;
the first protruding post is inserted through the mounting hole and the first limiting slot, and the second protruding post is inserted through the inclined slot and the second limiting slot.

10. The fixing device of claim 9, wherein:
the first limiting slot and the second limiting slot extend in the same direction.

11. The fixing device of claim 10, wherein:
the plurality of protruding posts further comprises a third protruding post;
the plurality of limiting slots further comprises a third limiting slot;
the third limiting slot extends in the same direction as the first limiting slot and the second limiting slot; and
the third protruding post is inserted through the third limiting slot.

12. The fixing device of claim 11, wherein:
the second fixing member further comprises a resisting portion;
the hook body defines a through hole;
the resisting portion is inserted through the through hole;
when the second fixing member is pulled, the resisting portion resists an inner wall of the through hole to apply a force on the hook body.

13. The fixing device of claim 12, wherein:
the first resilient member and the second resilient member are perpendicularly received between the first fixing member and the second fixing member.

14. The fixing device of claim 13, wherein:
the second fixing member defines an anti-slip groove.

15. The fixing device of claim 14, wherein:
the mounting frame comprises a latching member;
the hook body is configured to hook on the latching member;
when the second fixing member is pulled, the hook body disengages from the latching member to disengage the rotating buckle from the mounting frame.

* * * * *